United States Patent [19]

Ibrahim et al.

[11] Patent Number: 4,611,127
[45] Date of Patent: Sep. 9, 1986

[54] ELECTRONIC SENSOR FOR STATIC MAGNETIC FIELD

[75] Inventors: Ibrahim H. Ibrahim, North Ryde; Christopher N. Daly, Bilgola Plateau, both of Australia

[73] Assignee: Telectronics N.V., Curacao, Netherlands Antilles

[21] Appl. No.: 652,510

[22] Filed: Sep. 20, 1984

[51] Int. Cl.$^4$ ............................................. H01H 35/00
[52] U.S. Cl. .................................. 307/116; 307/415; 340/551; 324/236
[58] Field of Search ............... 307/116, 414, 415, 419, 307/421; 340/547, 551; 324/236, 237; 361/159

[56] References Cited

U.S. PATENT DOCUMENTS 4,130,792 12/1978 Sullivan ........................... 324/236 X
4,446,427 5/1984 Lovrenich ....................... 324/236 X
4,473,799 9/1984 Favre ............................... 324/236 X Primary Examiner—A. D. Pellinen
Assistant Examiner—Derek S. Jennings
Attorney, Agent, or Firm—Gottlieb, Rackman & Reisman

[57] ABSTRACT

A magnetic field sensor including a resonant circuit having a coil. The resonant frequency varies with the strength of the magnetic field which passes through the coil. The resonant circuit is energized for approximately one-half cycle of the resonant frequency which characterizes the circuit in the absence of a magnetic field. During a sensing window of predetermined duration which then immediately follows, the voltage across the coil is examined for a zero crossing. A zero crossing will occur only in the presence of a magnetic field whose amplitude exceeds a threshold value.

9 Claims, 8 Drawing Figures

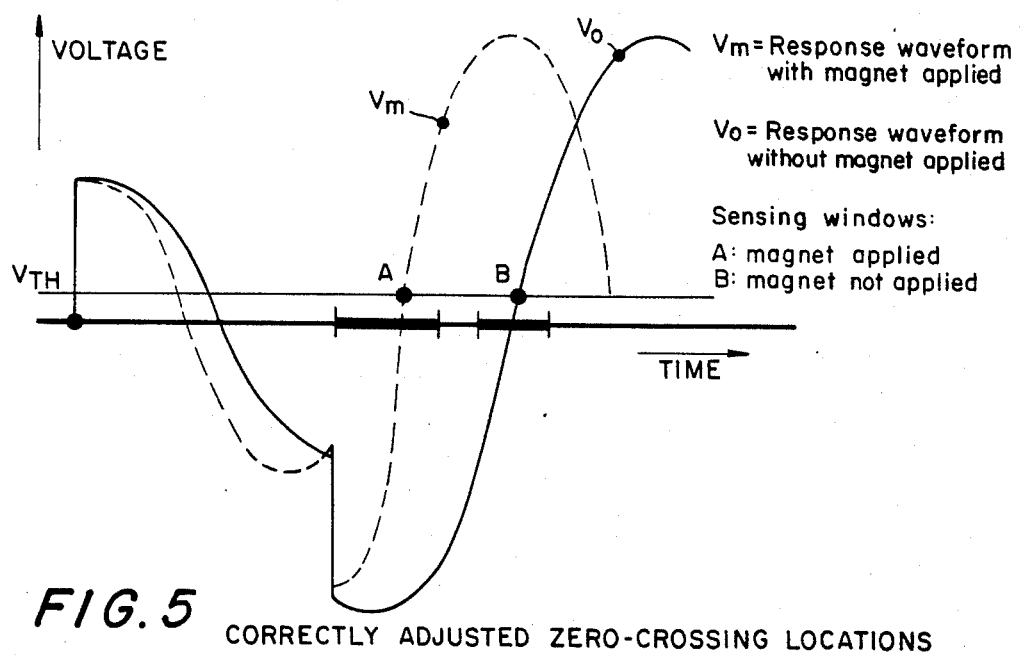
FIG. 5 CORRECTLY ADJUSTED ZERO-CROSSING LOCATIONS
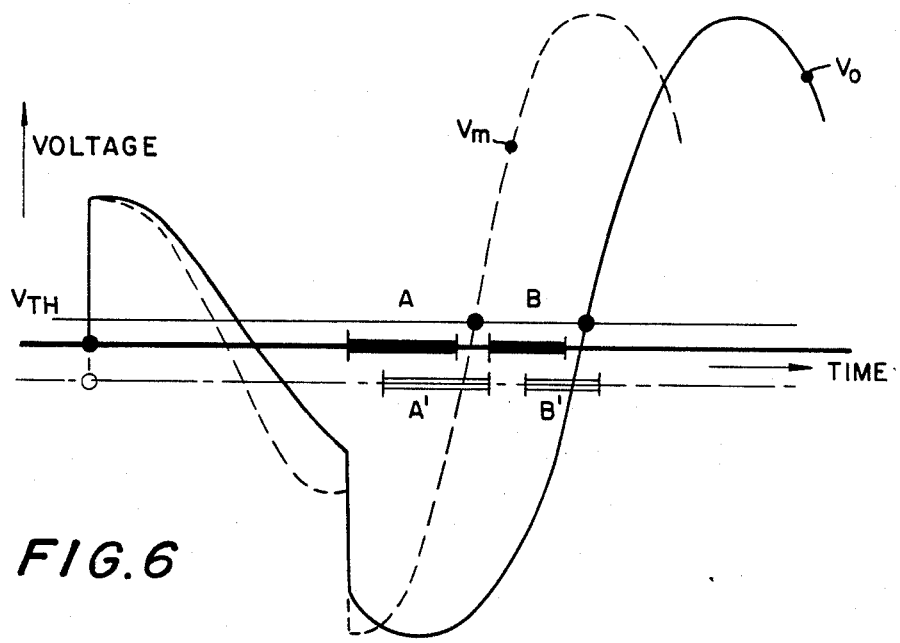
FIG. 6
EXAMPLE OF AUTOMATIC ADJUSTMENT OF
ZERO-CROSSING LOCATIONS

ELECTRONIC SENSOR FOR STATIC MAGNETIC FIELD

This invention relates to electronic sensors for sensing the presence of a static magnetic field, and more particularly to such a sensor whose operating DC current is relatively low, whose size is small, and whose sensitivity to a static magnetic field is high, while at the same time having a low sensitivity to noise, interference, and supply voltage fluctuations.

There are many electronic circuits for sensing the presence of, and even measuring the magnitude of, a static magnetic field. Many of these devices utilize the Hall effect. There are many applications, however, where the operating DC current of a Hall-effect device is too high. One such application is that of implantable medical devices. In order to detect the presence of a static magnetic field, a reed switch is usually employed because the current requirements of a Hall-effect sensor are too high. It is well known, however, that a reed switch is one of the components most likely to fail in a pacemaker or similar implantable medical device because the component is a mechanical device.

It is a general object of our invention to provide an electronic sensor for sensing the presence of a static magnetic field whose operating DC current is very small compared with that of a Hall-effect device having comparable sensitivity.

It is another object of our invention to provide such a sensor whose size is small (so that it is ideally suitable for pacemaker use), and while having high sensitivity to static magnetic fields exhibits low sensitivity to noise, interference and variations in supply voltage.

Although disclosed in the context of a threshold detector, the principles of our invention may be employed in a measurement device. In such a case, suitable calibration procedures would have to be incorporated so that the device would be capable of measuring magnetic field intensity, as opposed to simply indicating whether a preset threshold is exceeded as in the illustrative embodiment of the invention.

Briefly, we generate two signals, "excitation" and "sensing," the latter following the former and each having a predetermined duration. The excitation signal excites a coil. The coil is included in a resonant circuit, and a resonant current then flows. The sensing signal defines a window, and the resonant current exhibits different zero crossing characteristics during the duration of the sensing window in the presence and absence of a magnetic field of sufficient intensity. In the illustrative embodiment of the invention, a strong enough magnetic field reduces the dynamic core permeability of the coil, giving rise to a higher ringing frequency so that a zero crossing point of interest is shifted inside the sensing window.

Further objects, features and advantages of our invention will become apparent upon consideration of the following detailed description in conjunction with the drawing, in which:

FIG. 5 depicts a general case of correctly adjusted zero-crossing locations for one magnetic field which exceeds a threshold and one which does not; and FIG. 6 is an example of the kind of automatic adjustment of zero-crossing locations which can be built into more sophisticated embodiments of our invention.

Figure 1:
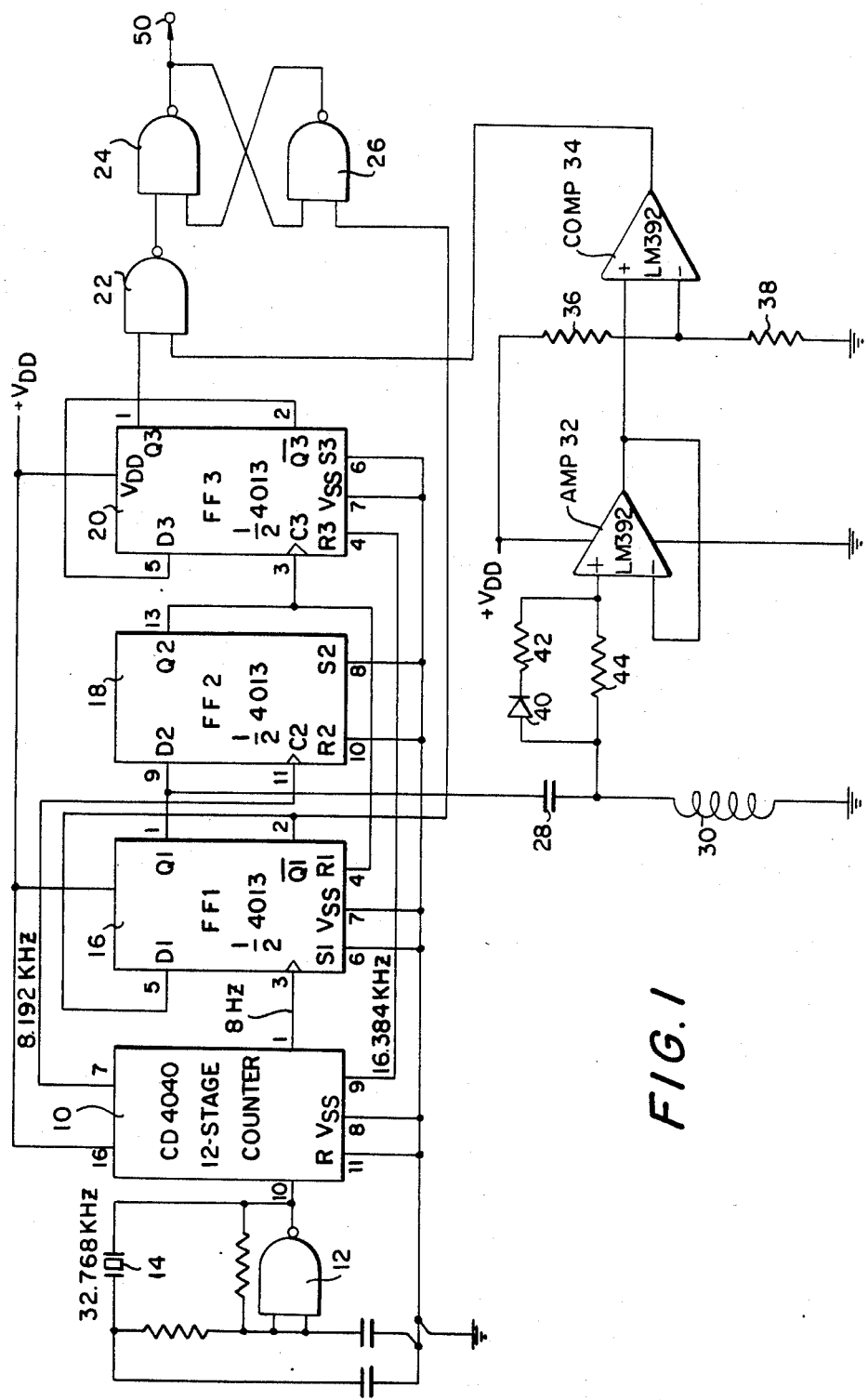
FIG. 1 depicts an illustrative embodiment of our invention.
Figure 2:
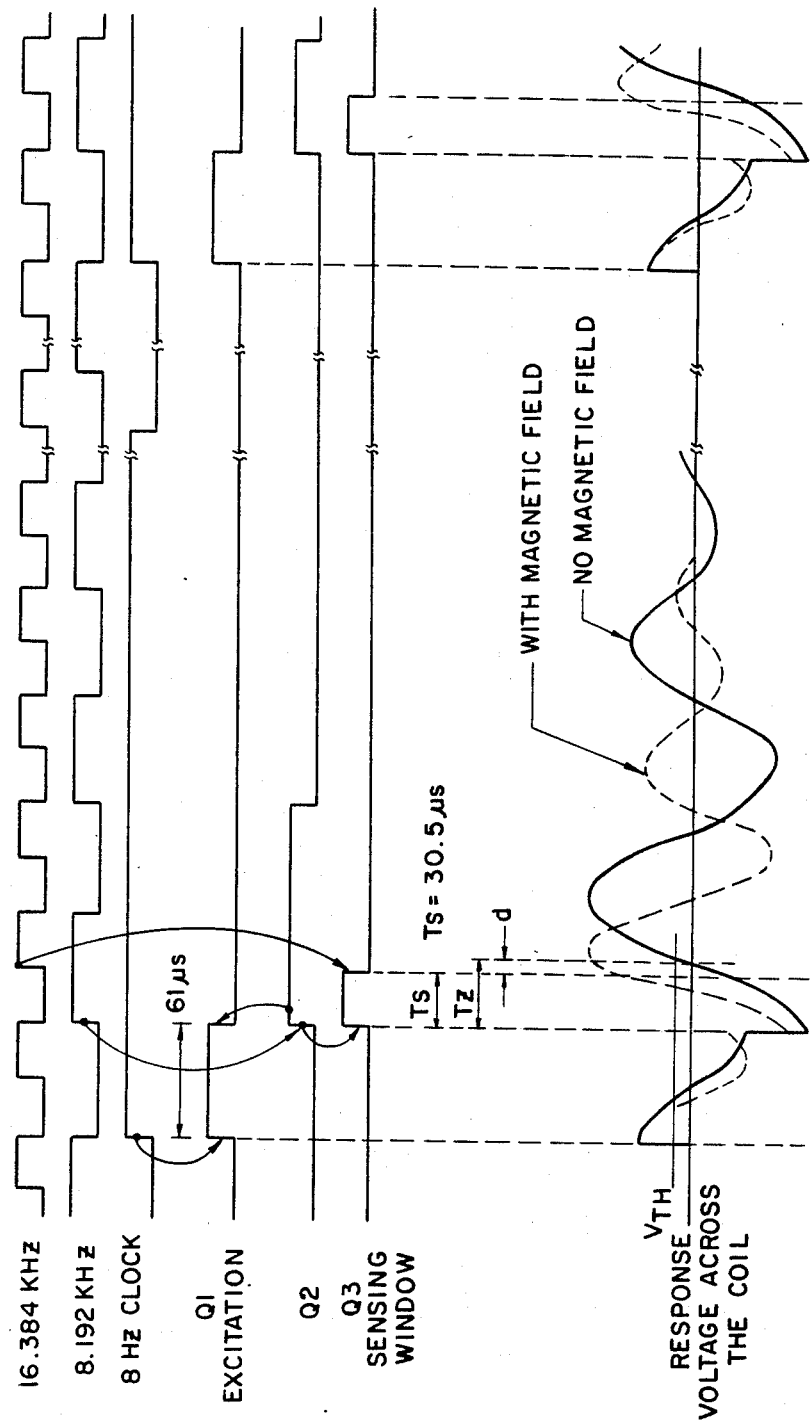
FIG. 2 depicts clock signals, and excitation and response waveforms which are applicable to the circuit of FIG. 1.

The upper, left part of the circuit of FIG. 1 is used to derive the clock signals, and the excitation and sensing window waveforms, depicted in the upper part of FIG. 2. A 12-stage counter 10, of type CD4040, is driven by a crystal oscillator. The oscillator includes a NAND gate 12, a 32.768-KHz crystal 14, and supporting components. Three clock signals are derived from the counter—an 8-Hz clock at pin 1, an 8.192-KHz clock at pin 7, and a 16.384-KHz clock at pin 9. These three signals are used to drive three flip-flops 16, 18 and 20, otherwise referred to as flip-flops FF1, FF2, and FF3. Each of these flip-flops can comprise one-half of a 4013 integrated circuit.

The first three waveforms on FIG. 2 depict the three clock signals. Each rising edge of the 8-Hz clock is used to clock flip-flop 16. Initially the flip-flop is reset. Since output pin 2 is connected to input pin 5, on the rising edge of the 8-Hz clock waveform, the flip-flop is set and its output at pin 1 goes high as depicted on the fourth waveform of FIG. 2.

The clock input of flip-flop 18 is driven by the 8.192-KHz clock signal from counter 10. When this signal first goes high following the 8-Hz clock signal having gone high, flip-flop 18 is set since the output of flip-flop 16 at pin 1 is connected to the input of flip-flop 18 at pin 9. At the same time that the output of flip-flop 18 goes high with the setting of the device, flip-flop 16 is reset because the output at pin 13 of flip-flop 18 is fed back to the reset input at pin 4 of flip-flop 16. As depicted on FIG. 2, the output at pin 1 of flip-flop 16 remains high for 61 microseconds, defining the excitation interval.

At the same time that flip-flop 16 is reset, flip-flop 20 is clocked. In fact, the same rising signal at pin 13 of flip-flop 18 resets flip-flop 16 and clocks flip-flop 20. Since flip-flop 20 is normally reset with its output pin 2 being at a high potential, and since this pin is connected to input pin 5, flip-flop 20 is set at the same time that flip-flop 16 is reset. Output pin 1 of flip-flop 20 goes high, as depicted in FIG. 2, to define the start of the sensing window. Flip-flop 20 is reset when the 16.384-KHz clock signal goes high. This is shown on FIG. 2. The duration of the sensing window is 30.5 microseconds.

At the end of the sensing window, the only flip-flop which remains set is flip-flop 18. This device is reset when it is next clocked, with the rising edge of the 8.192-KHz clock signal. Since at this time the output at pin 1 of flip-flop 16 is low, flip-flop 18 is reset as indicated in FIG. 2.

It is thus apparent that at intervals of one-eighth of a second, there is a 61-microsecond excitation interval, followed immediately by a 30.5-microsecond sensing interval. A less complex system may employ monostable multivibrators that are triggered periodically.

The excitation signal, the 61-microsecond pulse at the pin 1 output of flip-flop 16, is applied to the series resonant circuit comprising capacitor 28 and coil 30. When a step voltage is applied to a series resonant circuit, because the voltage across a capacitor cannot change instantaneously, the full step appears across the coil. The voltage across the coil, in the absence of a magnetic field, is shown by the solid line at the bottom of FIG. 2. At the start of the excitation interval, it is seen that the voltage across the coil rises abruptly. The resonant circuit is tuned to 8 KHz when no magnetic field is applied. Thus while the step voltage remains applied to the resonant circuit, the voltage across the coil goes from its maximum positive level to approximately its maximum negative level. There is a zero crossing in about the middle of the excitation interval. At the end of the excitation pulse, the potential at the top of capacitor 28 suddenly drops. Since the potential across a capacitor cannot change instantaneously, the potential at the junction of the capacitor and the coil drops by the same amount. This is also shown in FIG. 2; at the start of the sensing window, the potential at the top of the coil is negative and its magnitude is just about twice the amplitude of the previously high potential at the pin 1 output of flip-flop 16.

With the pin 1 output of flip-flop 16 now low, capacitor 28 and coil 30 are in effect connected in parallel. The current originally flowing through the coil now oscillates. The sensing window is only half the width of the excitation interval. Thus it would be expected that the second zero crossing would occur just about at the end of the sensing window. Actually, as indicated in FIG. 2, the second zero crossing in the absence of a magnetic field occurs slightly after the sensing window. The reason for this is that the resonant frequency of the coil is 8 KHz, while the sensing window is one-quarter of a complete cycle of an 8.192-KHz clock signal. The current continues to ring, an eventually dissipates as shown in FIG. 2.

With a strong enough magnetic field applied to the ferromagnetic-core coil, however, the dynamic core permeability is smaller and the ringing frequency increases, as shown by the dashed line response in FIG. 2. The second zero crossing point (the first following start of the sensing window) now occurs inside the sensing window. If the zero crossing point is shifted sufficiently to the left in FIG. 2 so that the voltage across the coil exceeds the threshold level indicated, then it is an indication that the magnetic field which is present exceeds the threshold level which the system is designed to detect.

Referring to FIG. 1, an LM392 amplifier-comparator integrated circuit is provided. One half of the device, shown by the numeral 32, is used as an amplifier, with diode 40 and resistors 42, 44 being connected in a standard configuration to the non-inverting input, and the second half of the device, shown by the numeral 34, is used as a comparator, with resistors 36, 38 defining a threshold voltage level applied to the inverting input. When the voltage across the coil exceeds the threshold level, the output of the comparator goes high. At this time both inputs to gate 22 are enabled, since one input is connected to pin 1 of flip-flop 20 which defines the sensing window in the first place. The output of gate 22 goes low and sets the flip-flop comprising gates 24, 26. Output terminal 50 thus goes high to indicate that the magnetic field that is present exceeds the threshold level. Terminal 50 remains high until the flip-flop is reset. This takes place when pin 2 of flip-flop 16 goes low, that is, when flip-flop 16 is next set. Since this flip-flop is set at the start of the excitation interval, terminal 50 remains high for almost the duration of the overall one-eighth second cycle, providing an almost continuous signal indicating the presence of a magnetic field.

Figure 4A:
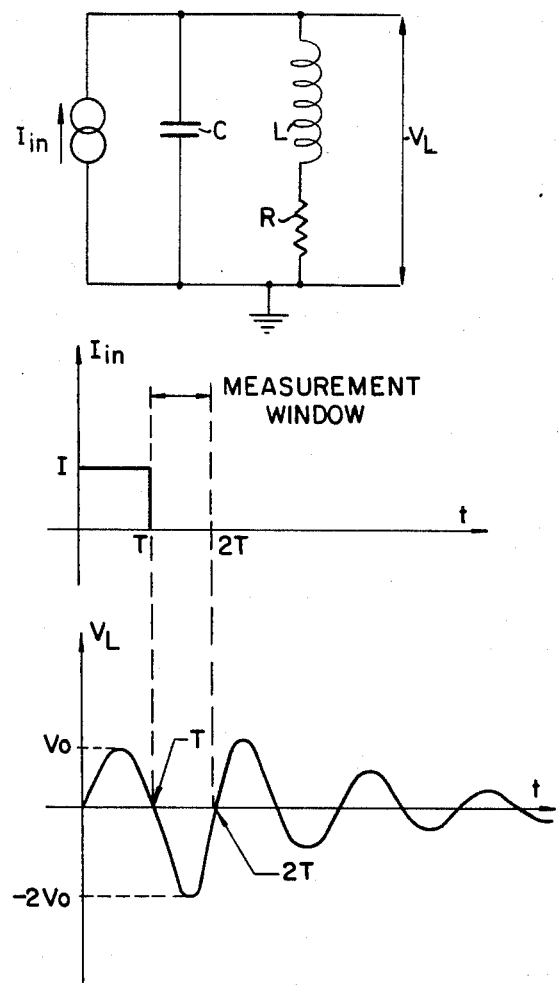
FIGS. 4A and 4B depict square wave excitation and response waveforms for parallel and series resonance respectively, and illustrate the general principles of our invention.
Figure 4B:
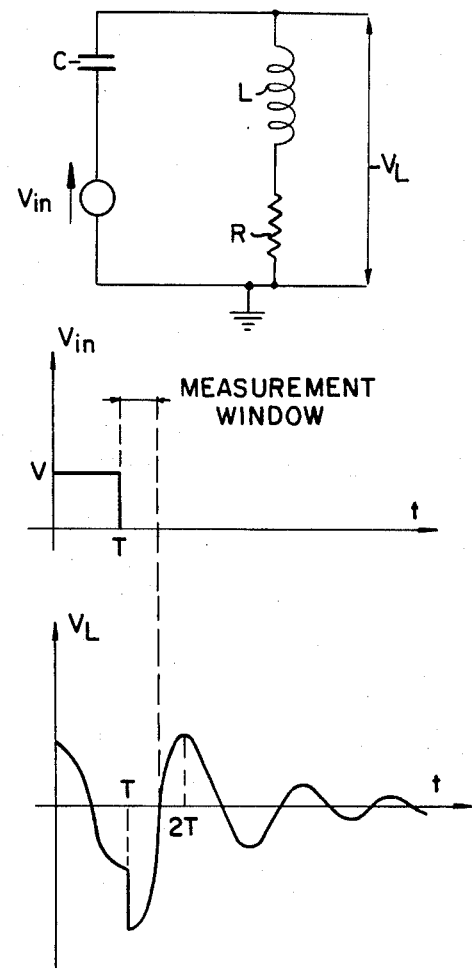

FIGS. 4A and 4B depict symbolically the excitation and response waveforms for parallel and series resonance. FIG. 4B corresponds to the system shown in FIG. 1 and whose applicable waveforms are illustrated in FIG. 2. It will be noted that a voltage step is applied across a series circuit comprising a capacitor and inductor, with the voltage across the inductor being measured to see if it exceeds a threshold level. (There is a correspondence between shifting zero crossings, and a potential at some point in a resonant circuit exceeding a threshold value; in fact, a zero crossing represents a threshold value being exceeded.) The upper part of FIG. 4B depicts a schematic diagram of the system, with the resistor shown being included to represent whatever resistance is included in the resonant circuit. The middle drawing of FIG. 4B depicts the duration of the excitation interval and the sensing (measurement) window, with the lower drawing corresponding to the voltage across the coil as depicted at the bottom of FIG. 2.

FIG. 4A, on the other hand, depicts the case of parallel resonance. In this case a current step may be applied to a parallel connection of a capacitor and an inductor. Once again, there is resistance associated with the inductor and it is shown. The voltage across the inductor once again is the quantity which is measured. Referring to the bottom drawing in FIG. 4A, however, it will be seen that in the case of a parallel circuit the voltage across the coil goes from zero to zero during the half-cycle excitation interval. It requires the same amount of time to complete another half cycle (to reach another zero crossing), and thus the measurement window is shown as long as the excitation interval. In other words, the measurement or sensing window in the case of parallel resonance is twice the duration of the measurement window in the case of series resonance. Once again, in the presence of a sufficiently strong magnetic field the zero crossing of interest will fall within the sensing window and the output of the circuit will be latched high.

Figure 3A:
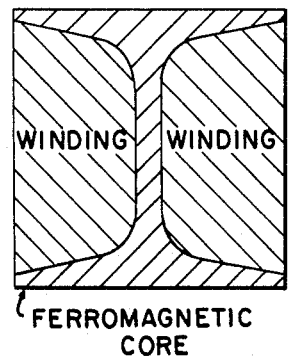
FIG. 3A depicts a preferred coil core for use in the system of FIG. 1.
Figure 3B:
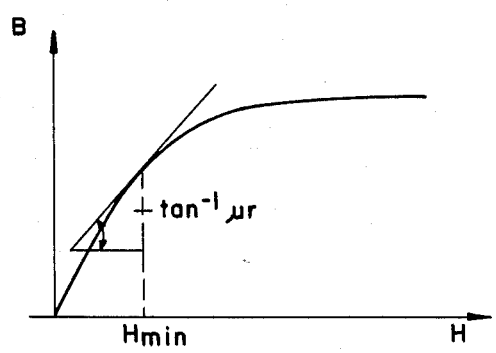
FIG. 3B depicts its B-H curve.

The sensitivity of the system can be made very high by careful design of the coil core. Referring to FIG. 3A which depicts a cross-section of the core, it should have large-area pole faces but a small core diameter. In this way the field collected by the poles will be concentrated through the thin core, thus changing its permeability considerably. The B-H curve is another important factor, and it is shown in FIG. 3B. At the lowest magnetic field level of interest (the minimum value of H), there should be some nonlinearity, as indicated in FIG. 3B. In other words, if the minimum magnetic field strength to be detected is applied to the coil, the permeability of the core should change by an amount sufficient to shift the zero crossing point of the ringing voltage inside the sensing window. The greatest sensitivity can be obtained when the slope of the B-H curve changes at a fast rate.

Sensing sensitivity depends upon three factors. The first is the width of the sensing window, and the distance between the falling edge of that window and the zero crossing point of the response waveform across the coil in the absence of an external magnetic field. This distance is shown by the letter d in FIG. 2. The second factor is the voltage threshold to be reached when the magnetic field is applied. This is shown by the symbol $V_{Th}$ in FIG. 2. The third factor is the dynamic core permeability referred to in connection with FIG. 3B.

The effect of the different factors mentioned above can be formulated as following. Referring to FIG. 2, and assuming that the excitation voltage is $V_{DD}$, the response voltage across the coil during the sensing window is given by the following equation:

$$V = -2V_{DD} \cos(w_o t) \quad (1)$$

where $w_o$ is the resonant frequency. In such a case, there is a zero crossing at $T_Z = \pi/2w_o$.

The time $T_Z$ is slightly longer than the sensing window $T_S$. As shown in FIG. 2, $T_Z = T_S + d$. Thus the resonant frequency $w_o$ can be defined in terms of $T_S$ and d as follows: $w_o = \pi/2(T_S + d)$.

Increasing resonant frequency, which is what happens in the presence of a magnetic field, will shift the zero crossing point inside the sensing window and the output latch will be triggered if the voltage at the end of the sensing window exceeds the threshold $V_{Th}$. Therefore, if the new resonant frequency is $w_1$, then the output latch will be triggered when $$V_{Th} \leq -2V_{DD} \cos(w_1 T_S). \quad (2)$$

This means that the minimum value of resonant frequency $w_1$ which will result in the output latch being triggered is $$w_1 = (1/T_S) \cos^{-1}(V_{Th}/-2V_{DD}). \quad (3)$$

The minimum change in frequency which will result in triggering of the output latch is thus determined by forming the difference between $w_1$ and $w_o$:

$$(w_1 - w_o) = (1/T_S) \cos^{-1}(V_{Th}/-2V_{DD}) - \pi/2(T_S + d). \quad (4)$$

If the threshold voltage is assume to be a fraction k of the excitation voltage, such that $V_{Th} = kV_{DD}$, then the minimum change in frequency can be rewritten as $$(w_1 - w_o) = (1/T_S) \cos^{-1}(-k/2) - \pi/2(T_S + d). \quad (5)$$

If k is much less than 1, then $$\cos^{-1}(-k/2) = (\pi + k)/2. \quad (6)$$

Rewriting equation (5) using equation (6) yields $$(w_1 - w_o) = [\pi d + k(d + T_S)]/[2T_S(d + T_S)]. \quad (7)$$

If equation (7) is then divided by the original equation for $w_o$, the following relationship results:

$$(w_1 - w_o)/w_o = (1/\pi T_S)[\pi d + k(d + T_S)]. \quad (8)$$

Finally, assuming that $T_S$ is much greater than d, $$(w_1 - w_o)/w_o = (d/T_S) + (k/\pi). \quad (9)$$

The variation in frequency is caused by a variation in the relative permeability of the core from ur to (ur + $\Delta$u) which, in turn, causes a change in the inductance from L to (L + $\Delta$L). When the change is small, the relative change in permeability can be expressed by $\Delta u/\Delta r = \Delta L/L$. Because L is inversely proportional to the square of the frequency, $$\Delta L/L = \Delta u/ur = -2(\Delta w/w_o) = -2[d/T_s + k/\pi]. \quad (10)$$

The sensitivity is a measure of the percentage change necessary to trigger the output latch. In the above equations, $w_1$ is the minimum frequency necessary to cause the threshold voltage to be exceeded, and it is apparent from equations (9) and (10) that the sensitivity is a function of d, $T_S$ and k. Although very high sensitivity can be achieved, care must be taken that the sensitivity not be too high. If it is, it is possible that there will be false sensing in the presence of noise, or due to drift in component values. It is therefore usually necessary to compromise between high sensitivity on the one hand, and noise rejection and temperature drift of component values on the other hand. In the illustrative embodiment of the invention, with a coil whose Q factor was equal to 20, and with values of k = 0.02, d = 1.7 microseconds, and $V_{DD}$ = 5 volts, it was possible to tolerate a 5 percent variation in both the magnitude of inductor 30 and the magnitude of capacitor 28 without causing false triggering.

Excellent noise rejection can be achieved for several reasons. First, the noise is not effective unless it appears at a time just before the excitation or sensing windows. Second, most of the noise components are filtered out due to the high selectivity of the resonant circuit. Third, noise components which exist during the sensing window, and even if they have a frequency equal to that of the resonant circuit, will not be sensed unless it causes the voltage across the coil to reach or exceed the threshold level inside the sensing window.

It is possible to derive an equation for the minimum noise which must be present in order to falsely trigger the latch even though a magnetic field is not present. In the absence of a magnetic field, the voltage across the coil during the sensing window is $$V_L = -2V_{DD} \cos(w_o t),$$

and at $t = T_S$ the voltage is equal to:

$$V_L = -2V_{DD} \cos(w_o T_S) = 2V_{DD} \cos(w_o(T_Z - d)) = -2V_{DD} \cos(\pi/2 - w_o d).$$

Substituting $(V_{Th})/k = V_{DD}$, and using the equality $\sin A = \cos(\pi/2 - A)$, at the end of the sensing window the voltage across the coil is $$V_L = -\frac{2}{k} V_{Th} \sin(w_o d).$$

Assuming that there is a noise voltage $V_n$ superimposed on the coil, the coil voltage is $$V_L = V_n - \frac{2}{k} V_{Th} \sin(w_o d).$$

For this voltage to exceed the threshold voltage $V_{Th}$, the minimum noise voltage can be determined by solving for $V_n$ when $V_L = V_{Th}$:

$$V_n = V_{Th}\left(1 + \frac{2}{k} \sin(w_o d)\right).$$

Thus it is apparent that the minimum noise voltage which will falsely trigger the system can be increased by increasing d. While this will improve the noise rejection, it will also reduce the sensitivity and it is always necessary to compromise between the two competing objectives.

Although the circuit of FIG. 1 consumes about 0.5 milliamperes, primarily due to the LM392 integrated circuit, the average current consumption can be reduced to below ten microamperes if CMOS circuits are used.

While the illustrative embodiment of the invention allows for variations of up to 5 percent in both the magnitude of the inductor and the magnitude of the capacitor in the resonant circuit, for applications which require a greater degree of precision it is possible to utilize self-adjusting techniques to track long-term variations of the resonant frequency as a function of the crystal oscillator time base of the system. FIG. 5 is self-explanatory and depicts proper zero-crossing locations both in the presence of a magnetic field and in the absence of one. FIG. 6, on the other hand, shows what happens when there has been a drift in the zero-crossing locations, for example, due to component changes. It is apparent that the zero crossing in the presence of a magnetic field occurs too late. Even the zero crossing which is expected in the absence of a magnetic field occurs too late (after another window B which could be used to positively sense the absence of a magnetic field). What is necessary in this case is to shift the two windows A and B to positions (in time) A' and B'. The new sensing windows (assuming that two windows are used, one for positively sensing the presence of a magnetic field and another for positively sensing the absence of a magnetic field) can be derived by using logic to generate excitation and sensing windows closest to the prevailing resonant frequency requirements. A reference magnetic field can be used to advantage in the self adjustment. But even without a reference magnetic field, self adjustment is possible. If the zero crossing point in the absence of a magnetic field falls outside the B windows as shown in FIG. 6, then the logic can adjust the excitation and sensing window widths so that the zero crossing falls within the new sensing window B'. By shifting the B sensing window to B, the A sensing window would be shifted to its new position A' at the same time.

Although the invention has been described with reference to a particular embodiment it is to be understood that this embodiment is merely illustrative of the application of the principles of the invention. Numerous modifications may be made therein and other arrangements may be devised without departing from the spirit and scope of the invention.

We claim:

1. A magnetic field sensor comprising a resonant circuit including a coil and whose resonant frequency varies with the strength of a magnetic field which passes through the coil, means for applying an energizing signal to said resonant circuit for a predetermined time interval, means for defining a sensing window which begins following the cessation of said energizing signal and ends at a predetermined time thereafter, and means for detecting whether the signal level at a selected point in the resonant circuit crosses a threshold level during said sensing window.

2. A magnetic field sensor in accordance with claim 1 wherein said resonant circuit rings following the cessation of the energization thereof, said detecting means operates on the voltage which appears across said coil, and said sensing window has a duration such that a zero crossing is detected during said sensing window only in the presence of a magnetic field having a predetermined minimum strength.

3. A magnetic field sensor in accordance with claim 2 wherein said energizing signal is applied to said resonant circuit repetitively at periodic intervals, and said sensing window defining means and said detecting means operate at the same periodic intervals.

4. A magnetic field sensor in accordance with claim 2 wherein said energizing signal is applied to said resonant circuit for approximately one-half cycle of the resonant frequency in the absence of a magnetic field.

5. A magnetic field sensor in accordance with claim 1 wherein said energizing signal is applied to said resonant circuit repetitively at periodic intervals, and said sensing window defining means and said detecting means operate at the same periodic intervals.

6. A magnetic field sensor in accordance with claim 1 wherein said energizing signal is applied to said resonant circuit for approximately one-half cycle of the resonant frequency in the absence of a magnetic field.

7. A magnetic field sensor comprising a resonant circuit including a coil and whose resonant frequency varies with the strength of a magnetic field which passes through the coil, means for applying an energizing signal to said resonant circuit for a predetermined time interval, said resonant circuit operating to ring following the cessation of the energization thereof, means for sensing a resulting signal level at a selected point in the resonant circuit following the cessation of the energization thereof, and means for determining whether said signal level as a function of time, following the cessation of the energization of said resonant circuit, is that expected in the presence of a magnetic field whose strength exceeds a predetermined level.

8. A magnetic field sensor in accordance with claim 7 wherein said energizing signal is applied to said resonant circuit repetitively at periodic intervals, and said sensing means and said determining means operate at the same periodic intervals.

9. A magnetic field sensor in accordance with claim 7 wherein said energizing signal is applied to said resonant circuit for approximately one-half cycle of the resonant frequency in the absence of a magnetic field.

* * * * *